United States Patent
Tsai et al.

(10) Patent No.: US 7,962,116 B1
(45) Date of Patent: *Jun. 14, 2011

(54) MIXER GAIN CALIBRATION METHOD AND APPARATUS

(75) Inventors: King Chun Tsai, San Jose, CA (US);
Lawrence Tse, Fremont, CA (US);
George Chien, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 50 days.

This patent is subject to a terminal disclaimer.

(21) Appl. No.: 12/287,928

(22) Filed: Oct. 15, 2008

Related U.S. Application Data

(63) Continuation of application No. 11/280,027, filed on Nov. 16, 2005, now Pat. No. 7,440,742, which is a continuation of application No. 10/292,087, filed on Nov. 11, 2002, now Pat. No. 6,983,135.

(51) Int. Cl.
*H04B 1/16* (2006.01)

(52) U.S. Cl. ..................... 455/326; 455/232.1

(58) Field of Classification Search ............... 455/232.1, 455/313, 323, 296, 333, 326
See application file for complete search history.

(56) References Cited

U.S. PATENT DOCUMENTS

| | | | |
|---|---|---|---|
| 4,031,469 A | 6/1977 | Johnson | |
| 5,212,826 A | 5/1993 | Rabe et al. | |
| 5,548,840 A * | 8/1996 | Heck .............................. | 455/326 |
| 5,724,653 A | 3/1998 | Baker et al. | |
| 5,752,171 A | 5/1998 | Akiya | |
| 5,805,988 A | 9/1998 | Clayton et al. | |
| 5,859,559 A | 1/1999 | Hong et al. | |
| 5,886,547 A | 3/1999 | Durec et al. | |
| 5,933,771 A | 8/1999 | Tiller et al. | |
| 6,081,701 A | 6/2000 | Norimatsu | |
| 6,118,811 A | 9/2000 | Narumi et al. | |
| 6,122,497 A | 9/2000 | Gilbert | |
| 6,140,849 A * | 10/2000 | Trask .............................. | 327/113 |
| 6,324,228 B1 | 11/2001 | Millward et al. | |
| 6,366,622 B1 | 4/2002 | Brown et al. | |
| 6,560,447 B2 | 5/2003 | Rahman et al. | |
| 6,621,345 B2 | 9/2003 | Matsugatani et al. | |
| 6,639,447 B2 | 10/2003 | Manku et al. | |
| 6,650,883 B1 | 11/2003 | Stephane et al. | |
| 6,684,065 B2 * | 1/2004 | Bult et al. .................. | 455/252.1 |
| 6,807,406 B1 | 10/2004 | Razavi et al. | |
| 6,850,753 B2 | 2/2005 | Zhang et al. | |
| 6,862,327 B2 | 3/2005 | Van Sinderen | |

(Continued)

OTHER PUBLICATIONS

IEEE Standard P802.11G, Draft Supplement to Standard for Information technology—Telecommunications and Information Exchange Between Systems; Local and Metropolitan Area Networks; Specific Requirements; Part 11: Wireless LAN Medium Access Control (MAC) and Physical Layer (PHY) Specifications: Higher-Speed Physical Layer Extension in the 2.4 GHz Band.

(Continued)

*Primary Examiner* — Blane J Jackson

(57) ABSTRACT

A receiver includes a Gilbert cell mixer comprising an input transconductance stage. The input transconductance stage includes first and second transistors receiving an input signal and providing a first gain characteristic that is substantially non-linear over an operating frequency range of the receiver. Third and fourth transistors receive the input signal and provide a second gain characteristic that is substantially non-linear over the operating range of the receiver. A combined gain characteristic of the input transconductance stage is based on the first and second gain characteristics and is substantially linear over the operating frequency range of the receiver.

22 Claims, 15 Drawing Sheets

U.S. PATENT DOCUMENTS

| | | |
|---|---|---|
| 6,865,382 B2 | 3/2005 | Behzad |
| 6,892,062 B2 * | 5/2005 | Lee et al. ............... 455/326 |
| 6,917,788 B2 | 7/2005 | Malhi et al. |
| 6,922,556 B2 | 7/2005 | Beumer |
| 6,944,438 B2 * | 9/2005 | Pellat et al. ............. 455/333 |
| 7,006,824 B1 | 2/2006 | Tse et al. |
| 7,057,426 B2 | 6/2006 | Yamaji et al. |
| 7,177,620 B1 | 2/2007 | Tsai et al. |
| 7,215,933 B1 | 5/2007 | Tse et al. |
| 2003/0003891 A1 | 1/2003 | Kivekas et al. |
| 2003/0069049 A1 | 4/2003 | Poranen et al. |
| 2005/0101280 A1 * | 5/2005 | Behzad ................... 455/293 |

OTHER PUBLICATIONS

IEEE Std 802.11b-1999 (Supplement to ANSI/IEEE Std 802.11, 1999 Edition—96 pages) Supplement to IEEE Standard for Information Technology—Telecommunications and information exchange between systems—Local and metropolitan area networks—Specific requirements, Part 11: Wireless LAN Medium Access Control (MAC) and Physical Layer (PHY) specifications: Further Higher Data Rate Extension in the 2.4 GHz Band, Apr. 2003, pp. 1-69.

* cited by examiner

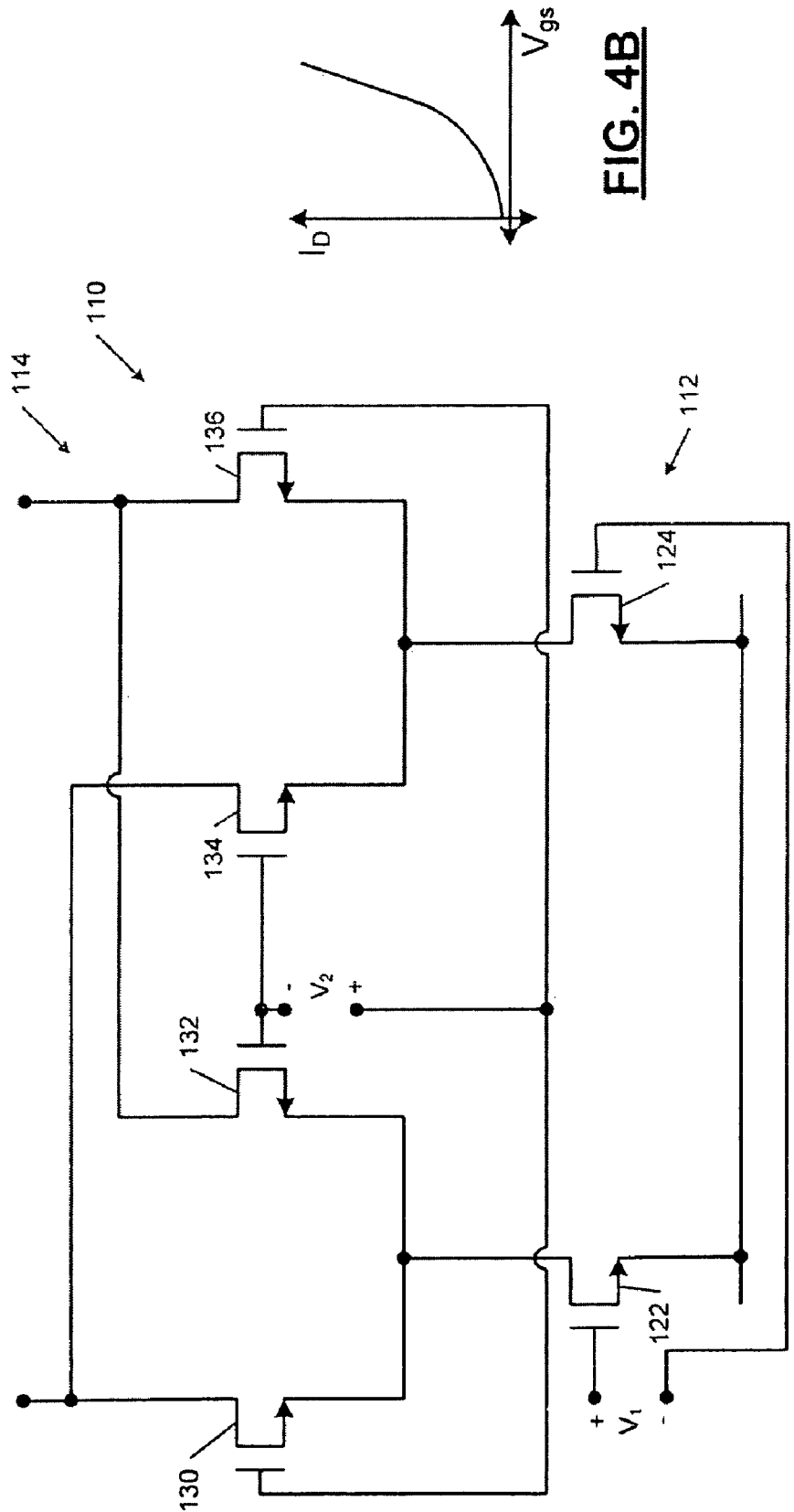

MIXER GAIN CALIBRATION METHOD AND APPARATUS

CROSS-REFERENCE TO RELATED APPLICATIONS

This application is a continuation of U.S. patent application Ser. No. 11/280,027, filed Nov. 16, 2005, which is a continuation of U.S. patent application Ser. No. 10/292,087, filed Nov. 11, 2002. The disclosures of the above applications are incorporated herein by reference in their entirety.

FIELD OF THE INVENTION

The present invention relates to gain calibration, and more particularly to gain calibration for radio frequency (RF) mixers that are implemented in wireless transceivers.

BACKGROUND OF THE INVENTION

Referring now to FIG. 1, a wireless transceiver 10 is shown and includes a transmitter 12 and a receiver 14. The wireless transceiver 10 may be used in a local area network (LAN) and may be attached to a Baseband Processor (BBP) and a Media Access Controller (MAC) in either a station or an Access Point (AP) configuration. A network interface card (NIC) is one of the various "STATION" configurations. The NIC can be connected to a networked device 16' such as a laptop computer, a personal digital assistant (PDA) or any other networked device. When the transceiver 10 is attached to an access point (AP) MAC, an AP is created. The AP provides network access for WLAN stations that are associated with the transceiver 10.

The wireless transceiver 10 transmits and receives frames/packets and provides communication between two networked devices. In AdHoc mode, the two devices can be two laptop/personal computers. In infrastructure mode, the two devices can be a laptop/personal computer and an AP.

There are multiple different ways of implementing the transmitter 12 and the receiver 14. For purposes of illustration, simplified block diagrams of super-heterodyne and direct conversion transmitter and receiver architectures will be discussed, although other architectures may be used. Referring now to FIG. 2A, an exemplary super-heterodyne receiver 14-1 is shown. The receiver 14-1 includes an antenna 19 that is coupled to an optional RF filter 20 and a low noise amplifier 22. An output of the amplifier 22 is coupled to a first input of a mixer 24. A second input of the mixer 24 is connected to an oscillator 25, which provides a reference frequency. The mixer 24 converts radio frequency (RF) signals to intermediate frequency (IF) signals.

An output of the mixer 24 is connected to an optional IF filter 26, which has an output that is coupled to an automatic gain control amplifier (AGCA) 32. An output of the AGCA 32 is coupled to first inputs of mixers 40 and 41. A second input of the mixer 41 is coupled to an oscillator 42, which provides a reference frequency. A second input of the mixer 40 is connected to the oscillator 42 through a −90° phase shifter 43. The mixers 40 and 41 convert the IF signals to baseband (BB) signals. Outputs of the mixers 40 and 41 are coupled to BB circuits 44-1 and 44-2, respectively. The BB circuits 44-1 and 44-2 may include low pass filters (LPF) 45-1 and 45-2 and gain blocks 46-1 and 46-2, respectively, although other BB circuits may be used. Mixer 40 generates an in-phase (I) signal, which is output to a BB processor 47. The mixer 41 generates a quadrature-phase (Q) signal, which is output to the BB processor 47.

Referring now to FIG. 2B, an exemplary direct receiver 14-2 is shown. The receiver 14-2 includes the antenna 19 that is coupled the optional RF filter 20 and to the low noise amplifier 22. An output of the low noise amplifier 22 is coupled to first inputs of RF to BB mixers 48 and 50. A second input of the mixer 50 is connected to oscillator 51, which provides a reference frequency. A second input of the mixer 48 is connected to the oscillator 51 through a −90° phase shifter 52. The mixer 48 outputs the I-signal to the BB circuit 44-1, which may include the LPF 45-1 and the gain block 46-1. An output of the BB circuit 44-1 is input to the BB processor 47. Similarly, the mixer 50 outputs the Q signal to the BB circuit 44-2, which may include the LPF 45-2 and the gain block 46-2. An output of the BB circuit 44-2 is output to the BB processor 47.

Referring now to FIG. 3A, an exemplary super-heterodyne transmitter 12-1 is shown. The transmitter 12-1 receives an I signal from the BB processor 47. The I signal is input to a LPF 60 that is coupled to a first input of a BB to IF mixer 64. A Q signal of the BB processor 47 is input to a LPF 68 that is coupled to a first input of a BB to IF mixer 72. The mixer 72 has a second input that is coupled to an oscillator 74, which provides a reference frequency. The mixer 64 has a second input that is coupled to the oscillator through a −90° phase shifter 75.

Outputs of the mixers 64 and 72 are input to a summer 76. The summer 76 combines the signals into a complex signal that is input to a variable gain amplifier (VGA) 84. The VGA 84 is coupled to an optional IF filter 85. The optional IF filter 85 is connected to a first input of an IF to RF mixer 86. A second input of the mixer 86 is connected to an oscillator 87, which provides a reference frequency. An output of the mixer 86 is coupled to an optional RF filter 88. The optional RF filter 88 is connected to a power amplifier 89, which may include a driver. The power amplifier 89 drives an antenna 90 through an optional RF filter 91.

Referring now to FIG. 3B, an exemplary direct transmitter 12-2 is shown. The transmitter 12-2 receives an I signal from the BB processor 47. The I signal is input to the LPF 60, which has an output that is coupled to a first input of a BB to RF mixer 92. A Q signal of the BB processor 47 is input to the LPF 68, which is coupled to a first input of a BB to RF mixer 93. The mixer 93 has a second input that is coupled to an oscillator 94, which provides a reference frequency. The mixer 92 has a second input that is connected to the oscillator 94 through a −90° phase shifter 95. Outputs of the mixers 92 and 93 are input to the summer 76. The summer 76 combines the signals into a complex signal that is input the power amplifier 89. The power amplifier 89 drives the antenna 90 through the optional RF filter 91. The RF and IF filters in FIGS. 2A, 2B, 3A and 3B may be implemented on-chip or externally.

The transmitter 12 typically includes circuit elements that are implemented with both on-chip integrated circuits and off-chip components. On-chip circuit elements are typically active and are implemented using modern semiconductor processes. The on-chip circuit elements typically include mixers, variable gain amplifiers, power amplifiers, low pass filters, etc. Off-chip circuit elements are passive and typically include filters and matching networks. Due to semiconductor process variations and sensitivity of the on-chip transceiver components to environmental variations, such as temperature, compensation of the on-chip circuit elements is performed to improve transceiver performance. The gain of the circuit elements, which also depends upon the external circuit elements, cannot be easily compensated. On-chip circuit elements can be compensated to provide finite and controlled performance and characteristics.

The mixers in the wireless transceiver 10 can be implemented using Gilbert cell mixers. Referring now to FIG. 4A, an exemplary Gilbert Cell mixer 110 that is implemented using CMOS transistors is shown. The Gilbert cell mixer 110 includes a first stage 112 that performs voltage to current conversion and a second stage 114 that performs frequency conversion. The Gilbert cell mixer 110 includes a first transistor 122 and a second transistor 124. The transistors 122 and 124 have a source that is connected to a reference potential such as ground. A gate of the first transistor 122 is connected to one lead of a first voltage source. A gate of the second transistor 124 is connected to another lead of the first voltage source.

The Gilbert cell mixer 110 further includes third, fourth, fifth, and sixth transistors 130, 132, 134, and 136. A drain of the first transistor 122 is coupled to sources of the third and fourth transistors 130 and 132. A drain of the second transistor 124 is coupled to sources of the fifth and sixth transistors 134 and 136.

A gate of the fourth transistor 132 is connected to a gate of the fifth transistor 134. The gates of the fourth and fifth transistors 132 and 134 are connected to a first lead of a second voltage source. Another lead of the second voltage source is connected to gates of the third and sixth transistors 130 and 136. A drain of the third transistor 130 is connected to a drain of the fifth transistor 134. A drain of the fourth transistor 132 is connected to a drain of the sixth transistor 136. Typically, the first voltage source is a radio frequency, intermediate frequency, or baseband signal requiring frequency conversion (up or down) and the second voltage source is a local oscillator.

Mixer linearity in the first stage is one of the key performance parameters of the wireless transceiver. Mixer linearity affects the receiver's ability to receive weak desired signals in the presence of strong adjacent-channel interference. Poor mixer linearity can cause excessive corruption in the transmitter spectrum and degrade signal integrity of the transmitter. When the mixer is implemented using some transistor technologies such as CMOS, the input linear range of the mixer varies significantly with temperature and process variations.

The ability to calibrate the gain of the mixer is also an important attribute of a mixer design. During volume production of the transceiver integrated circuit (IC), the values and/or characteristics of resistors, capacitors, transistors and other elements used in the wireless transceiver components may vary due to process variations. These variations may adversely impact performance of the transceiver IC. In use, power supply voltage variation and temperature variations of the environment may also adversely impact the performance of the transceiver IC.

SUMMARY OF THE INVENTION

A gain calibration circuit for a radio frequency (RF) mixer in a wireless transceiver includes a constant overdrive voltage generator that biases the RF mixer. A reference signal generator generates a reference signal. A comparator receives the reference signal and a second signal that is proportional to a mixer bias current flowing through the RF mixer and generates a difference signal. An adjustment circuit adjusts a transconductance gain of the RF mixer based on the difference signal.

In other features, the adjustment circuit adjusts the mixer bias current to adjust the transconductance gain. The adjustment circuit includes at least one of a plurality of binary weighted transconductance cells and a plurality of thermometer coded transconductance cells. The adjustment circuit adjusts the transconductance gain in discrete steps.

In still other features, the transconductance gain is calibrated at least once during idle time between data packets, after power on, after hardware reset, and after software reset. The reference signal generator includes a matched resistor and a current source.

A wireless receiver that receives data packets includes a receiver including a radio frequency (RF) receiver mixer having an input transconductance stage that is biased by a constant overdrive voltage. A receiver gain calibration circuit includes a reference signal generator that generates a reference signal. A comparator receives the reference signal and a second signal that is proportional to a mixer bias current flowing through the RF receiver mixer and generates a difference signal. An adjustment circuit adjusts a transconductance gain of the RF receiver mixer based on the difference signal.

In other features, the transconductance gain of the RF receiver mixer is proportional to a bias current of the RF receiver mixer. The RF receiver mixer is a Gilbert cell mixer that includes a compensated transconductance stage with first and second transistors that are operated in a saturation region and third and fourth transistors that are operated in a triode region. The adjustment circuit includes a plurality of binary weighted transconductance cells or thermometer coded transconductance cells.

In yet other features, the transconductance gain is calibrated during idle time between data packets. The transconductance gain is calibrated at least one of after power on, after hardware reset, and after software reset. The reference signal generator includes a matched resistor and a current source.

A wireless transmitter that transmits data packets includes a transmitter including a radio frequency (RF) transmitter mixer having an input transconductance stage that is biased by a constant overdrive voltage. A transmitter gain calibration circuit includes a reference signal generator that generates a reference signal. A comparator receives the reference signal and a second signal that is proportional to a mixer bias current flowing through the RF transmitter mixer and generates a difference signal. An adjustment circuit adjusts a transconductance gain of the RF transmitter mixer based on the difference signal.

The transconductance gain of the RF transmitter mixer is proportional to the mixer bias current of the RF transmitter mixer. The RF transmitter mixer is a Gilbert cell mixer that includes a compensated transconductance stage with first and second transistors that are operated in a saturation region and third and fourth transistors that are operated in a triode region. The adjustment circuit includes a plurality of binary weighted transconductance cells or thermometer coded transconductance cells.

In still other features, the transconductance gain is calibrated during idle time between data packets. The transconductance gain is calibrated at least one of after power on, after hardware reset, and after software reset. The reference signal generator includes a matched resistor and a current source.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4A is an electrical schematic of a Gilbert cell mixer implemented using CMOS transistors according to the prior art;

FIG. 4B illustrates mixer bias current $I_D$ as a function of $V_{GS}$ for a CMOS transistor;

DETAILED DESCRIPTION OF THE PREFERRED EMBODIMENTS

Figure 1:
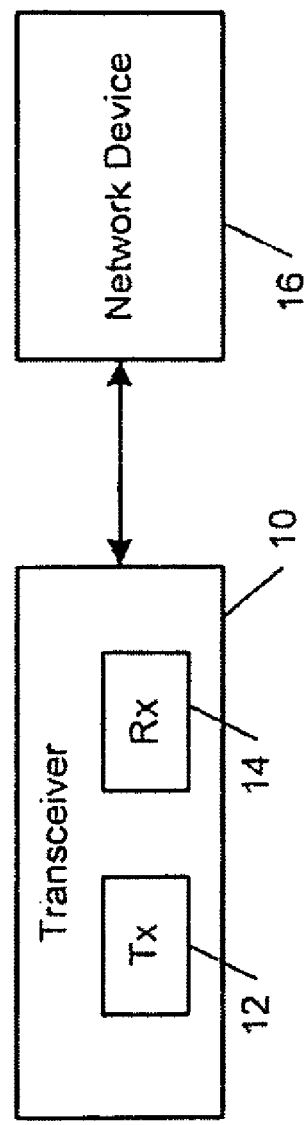
FIG. 1 is a functional block diagram of a wireless transceiver according to the prior art.
Figure 2A:
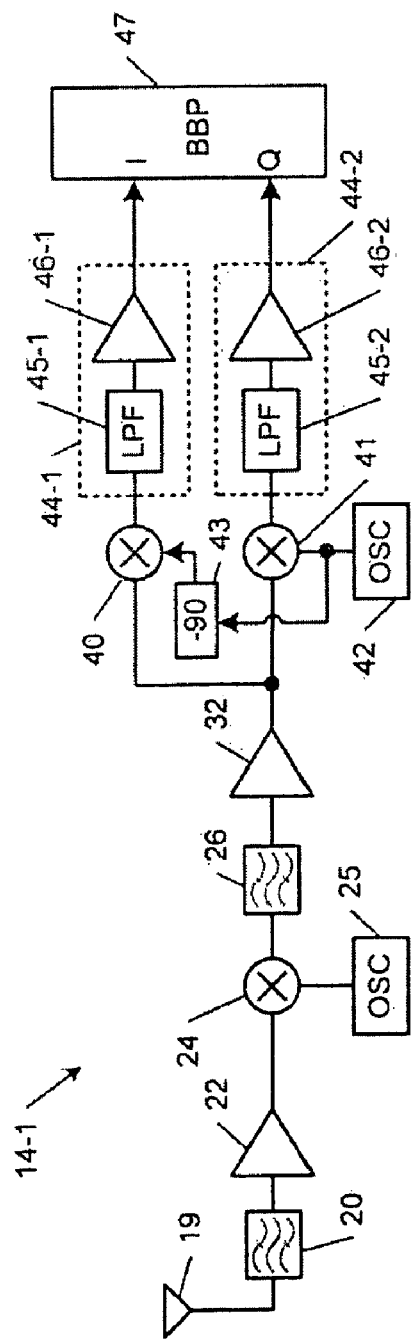
FIG. 2A is a functional block diagram of an exemplary super-heterodyne receiver architecture according to the prior art including one or more mixers.
Figure 2B:
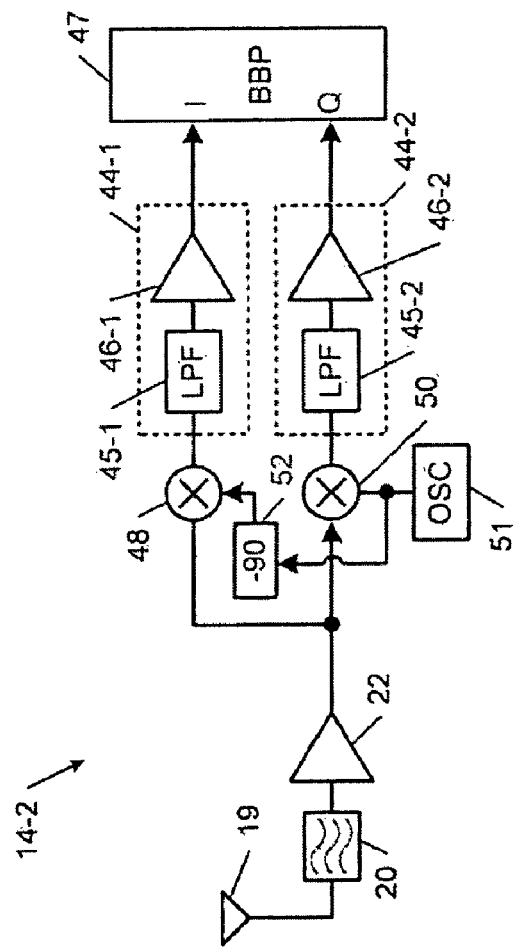
FIG. 2B is a functional block diagram of an exemplary direct receiver architecture according to the prior art including one or more mixers.
Figure 3A:
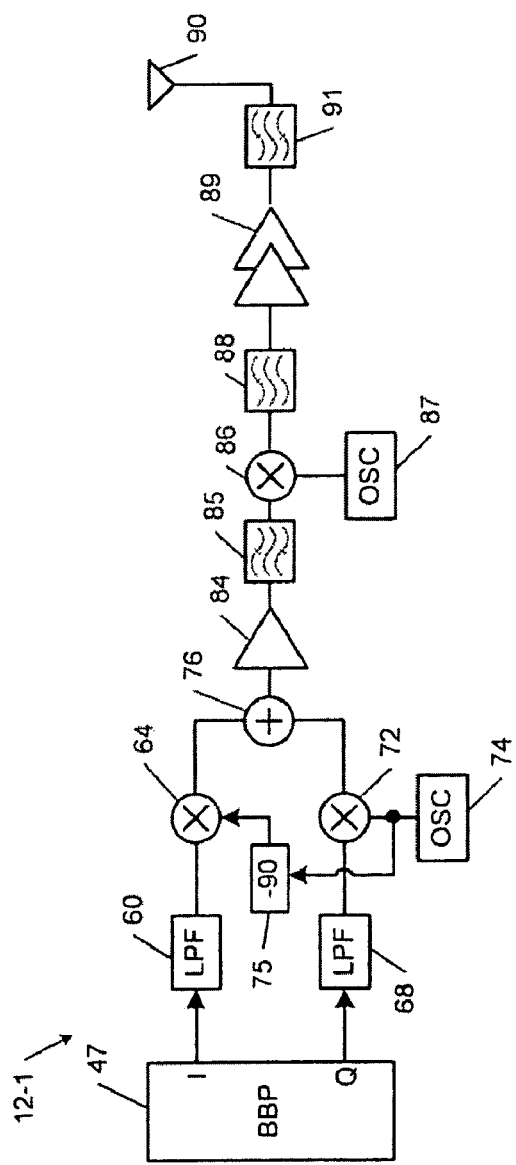
FIG. 3A is a functional block diagram of an exemplary super-heterodyne transmitter architecture according to the prior art including one or more mixers.
Figure 3B:
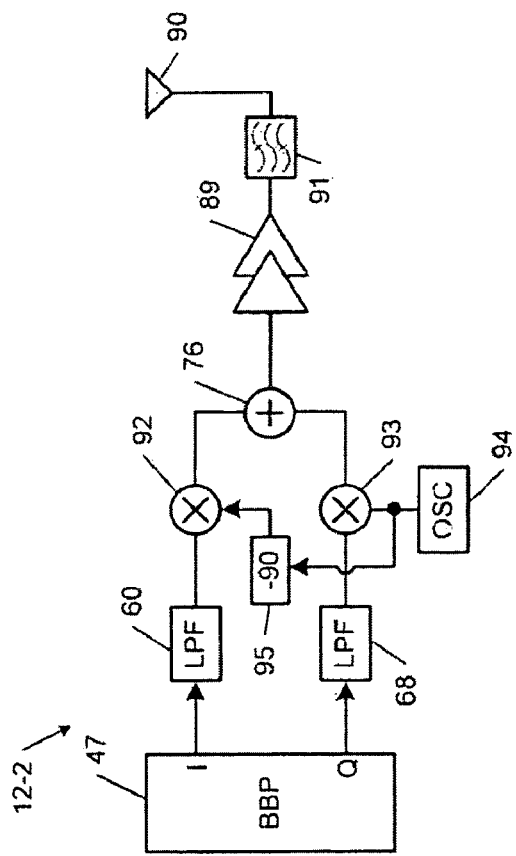
FIG. 3B is a functional block diagram of an exemplary direct transmitter architecture according to the prior art including one or more mixers.

The following description of the preferred embodiment(s) is merely exemplary in nature and is in no way intended to limit the invention, its application, or uses. For purposes of clarity, the same reference numbers will be used in the drawings to identify similar elements.

Figure 5A:
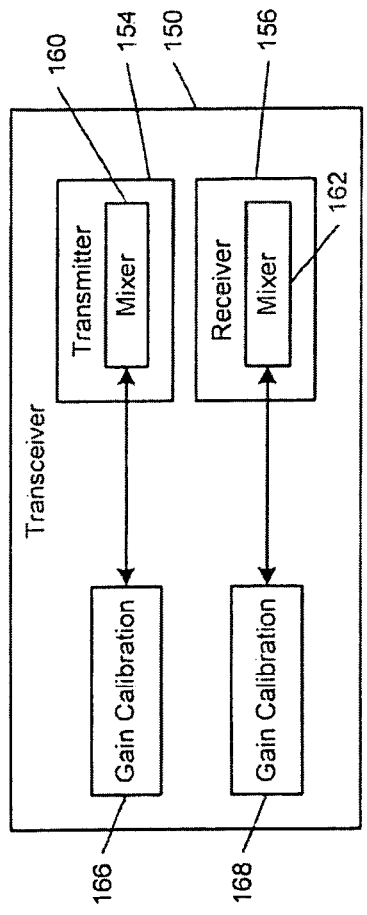
FIG. 5A is a functional block diagram of a wireless transceiver including gain calibration circuits according to the present invention for adjusting transmitter and receiver RF mixer gain.

Referring now to FIG. 5A, a transceiver 150 according to the present invention includes a transmitter 154 and a receiver 156 with RF mixers 160 and 162, respectively. Gain calibration circuits 166 and 168 calibrate transmitter and receiver mixer gain, respectively. Calibration according to the present invention includes calibration during events such as power on, hardware reset, software reset and/or packet-based calibration during idle time between packets.

Figure 5B:
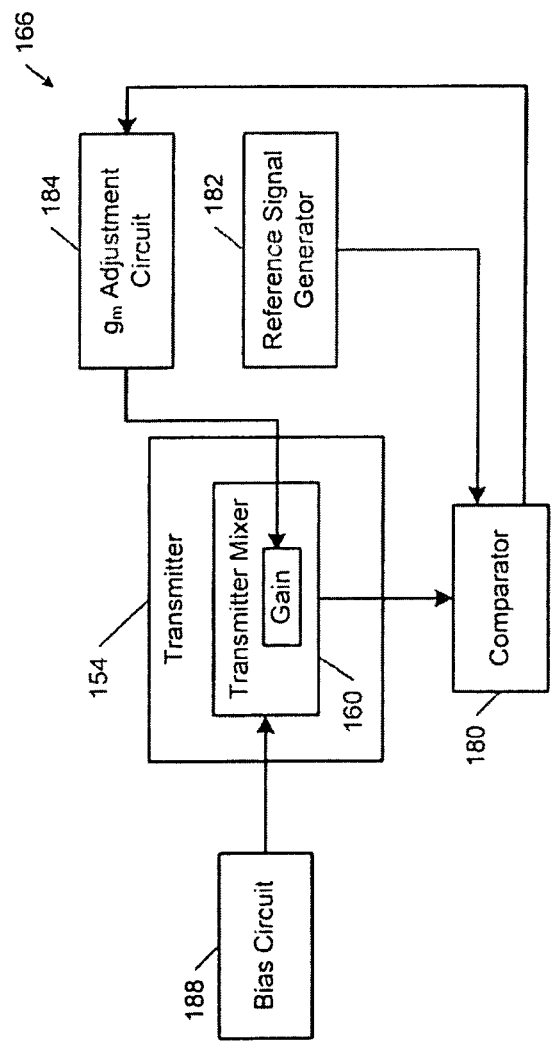
FIG. 5B is a functional block diagram of a gain calibration circuit for the transmitter RF mixer.

Referring now to FIG. 5B, the calibration circuit 166 includes a comparator 180, a reference signal generator 182 and a transconductance $g_m$ adjustment circuit 184. The reference signal generator 182 generates a reference current signal that is input to the comparator 180. The transmitter mixer 160 generates an output current signal that is input to the comparator 180. The output of the comparator 180 is input to the $g_m$ adjustment circuit 184, which adjusts the gain of the transmitter mixer 160.

The transconductance $g_m$ of the transmitter mixer 160 is proportional to a mixer bias current $I_D$ divided by $V_{Dsat}$. According to the present invention, a bias circuit 188 is employed to provide a constant $V_{Dsat}$ to improve mixer linearity. Because $V_{Dsat}$ is effectively constant over temperature and process corners, the $g_m$ of the transmitter mixer 160 is proportional the mixer bias current $I_D$, since $g_m \approx 2\, I_D/V_{Dsat}$. The $g_m$ adjustment circuit 184 according to the present invention uses one or more binary weighted $g_m$ stages to increase or decrease the mixer bias current $I_D$ in fixed steps. In doing so, the transconductance $g_m$ of the transmitter mixer 160 can be accurately calibrated.

Figure 5C:
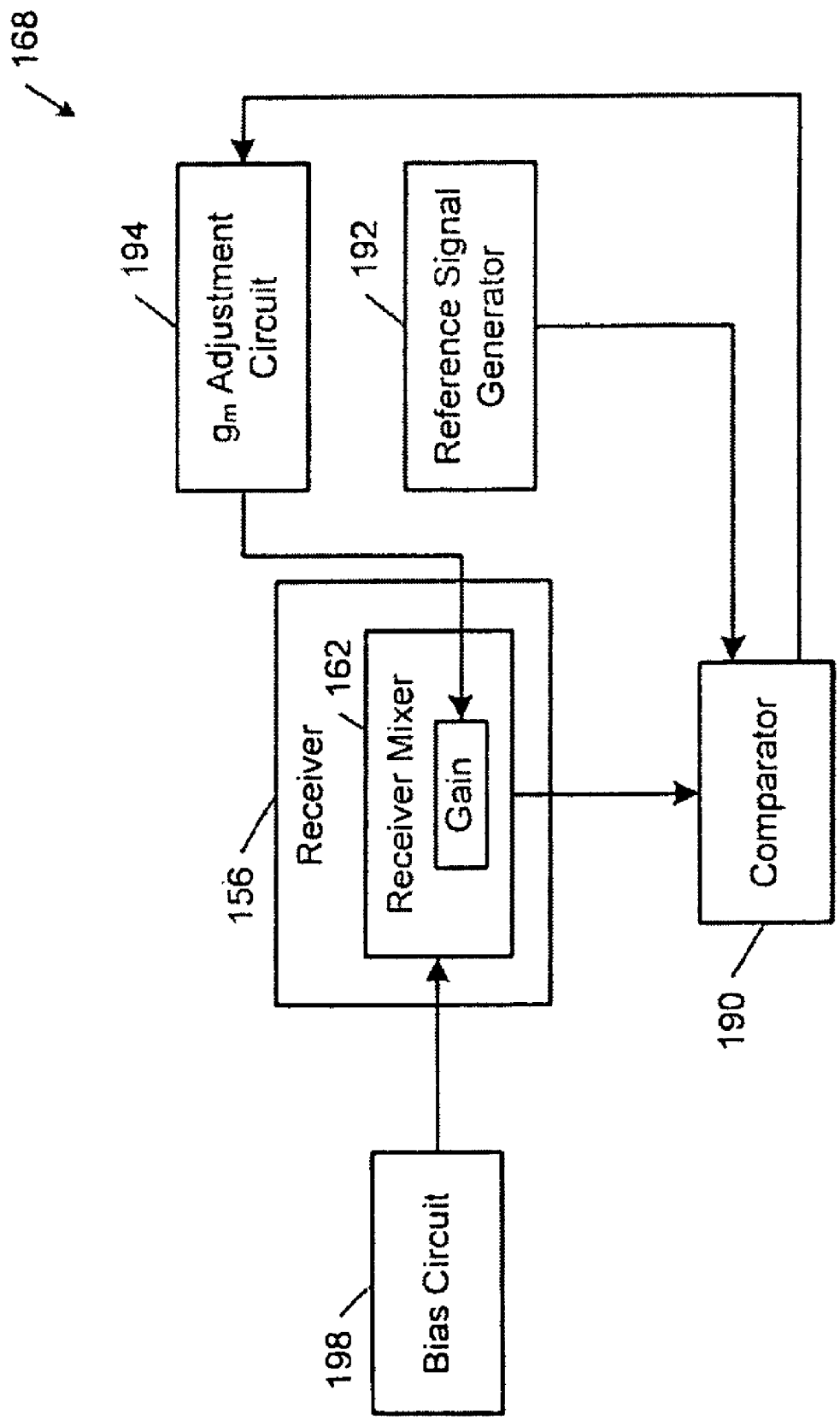
FIG. 5C is a functional block diagram of a gain calibration circuit for the receiver RF mixer.

Referring now to FIG. 5C, the calibration circuit 168 includes a comparator 190, a reference signal generator 192 and a $g_m$ adjustment circuit 194. The reference signal generator 192 generates a reference current signal that is input to the comparator 190. The receiver mixer 162 generates an output current signal that is input to the comparator 190. The output of the comparator 190 is input to the $g_m$ adjustment circuit 194, which adjusts the gain of the receiver mixer 162.

Likewise, the transconductance $g_m$ of the receiver mixer 162 is proportional to $I_D/V_{Dsat}$. According to the present invention, a bias circuit 198 is employed to provide a constant $V_{Dsat}$ to improve mixer linearity. Because $V_{Dsat}$ is effectively constant over temperature and process corners, the $g_m$ of the receiver mixer 162 is proportional the mixer bias current $I_D$. The $g_m$ adjustment circuit 194 according to the present invention likewise uses one or more binary weighted $g_m$ stages that increase or decrease the mixer bias current $I_D$ in fixed steps. In doing so, the transconductance $g_m$ of the receiver mixer 162 can also be calibrated.

Figure 6:
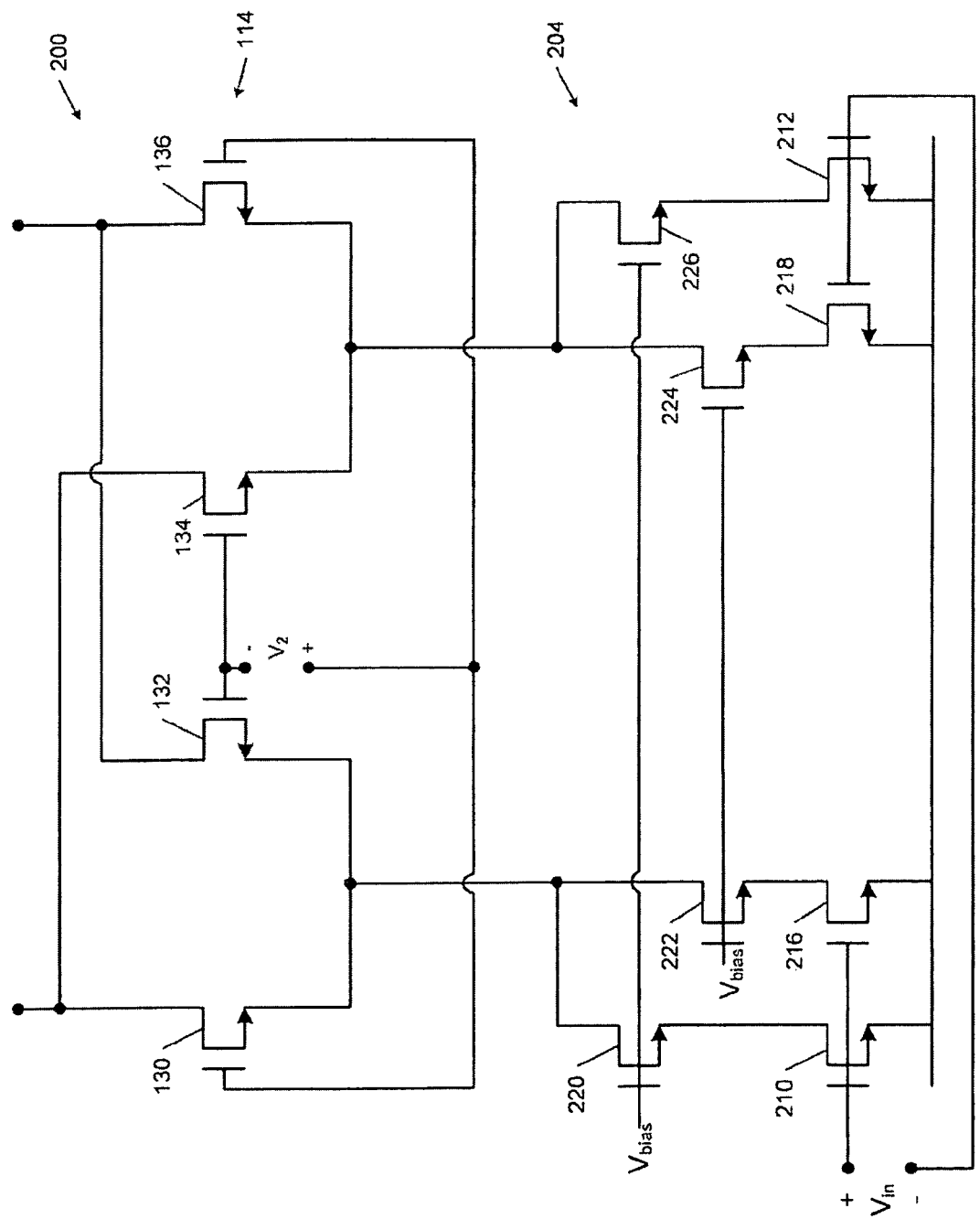
FIG. 6 illustrates a Gilbert cell mixer including a compensated input transconductor stage according to the present invention.

In the Gilbert-cell mixer 110 in FIG. 4A, the linearity of the mixer 110 is limited by the linearity of the first or input transconductor stage 112. Mixer linearity can be improved by linearizing the input transconductance stage 112. Referring now to FIG. 6, a Gilbert cell mixer 200 according to the present invention is shown and includes a compensated input transconductor stage 204. The compensated input transconductor stage 204 includes two pairs of transistors. A first pair of transistors 210 and 212 are biased into a saturation region. A second pair of transistors 216 and 218 are biased into a triode region.

Figure 7B:
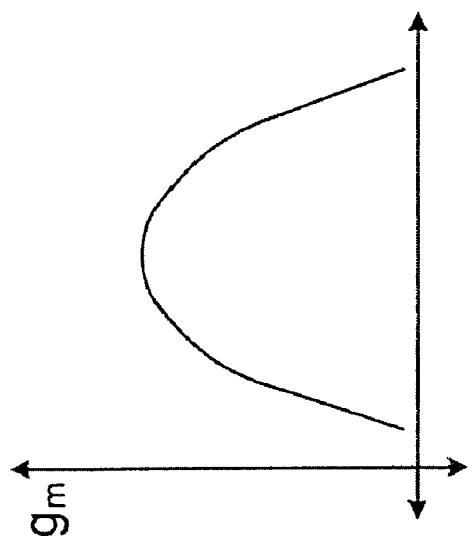
FIGS. 7A, 7B and 7C show transconductance ($g_m$) of transistor pairs as a function of differential input voltage for triode operation, saturated operation and combined operation, respectively.
Figure 7C:
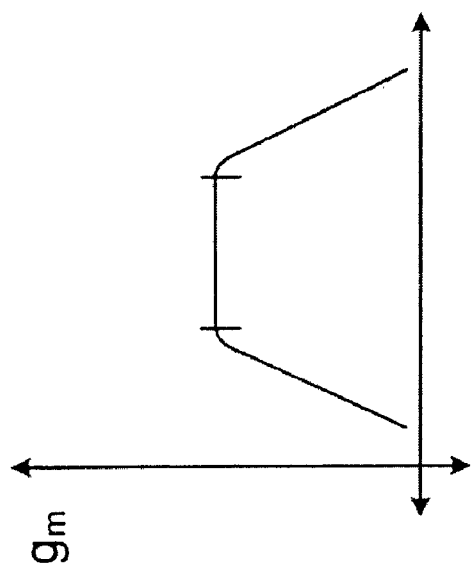
Figure 7A:
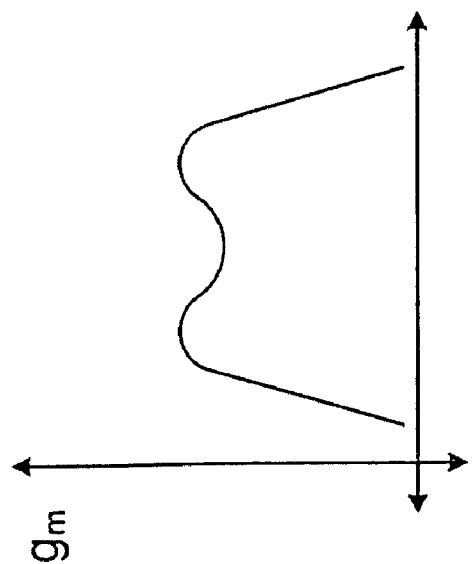

Referring now to FIGS. 7A, 7B and 7C, with proper biasing and device sizing, a gain characteristic of the saturation transistors 210 and 212 (shown in FIG. 7A) can be substantially cancelled by a gain characteristic of the triode transistors 216 and 218 (shown in FIG. 7B). The combined gain of the triode and saturation transistor pairs forms a substantially flat gain response that is shown in FIG. 7C.

Referring back to FIG. 6, sources of the transistors 210, 212, 216, and 218 are connected to a reference potential such as ground. The compensated input transconductor stage 204 further includes transistors 220, 222, 224, and 226. A source of the transistor 220 is connected to a drain of the transistor 210. A gate of the transistor 220 is connected to a gate of the transistor 226. A drain of the transistor 220 is connected to a drain of the transistor 222 and to sources of the transistors 130 and 132. A gate of the transistor 222 is connected to a gate of the transistor 224.

A drain of the transistor 226 is connected to a drain of the transistor 224 and to sources of the transistors 134 and 136. A source of the transistor 224 is connected to a drain of the transistor 218. A source of the transistor 226 is connected to a drain of the transistor 212. A gate of the transistor 212 is connected to a gate of the transistor 218. A gate of the transistor 210 is connected to a gate of the transistor 216. The transistors 220-226 preferably provide biasing for the transistors 210-218.

Figure 8:
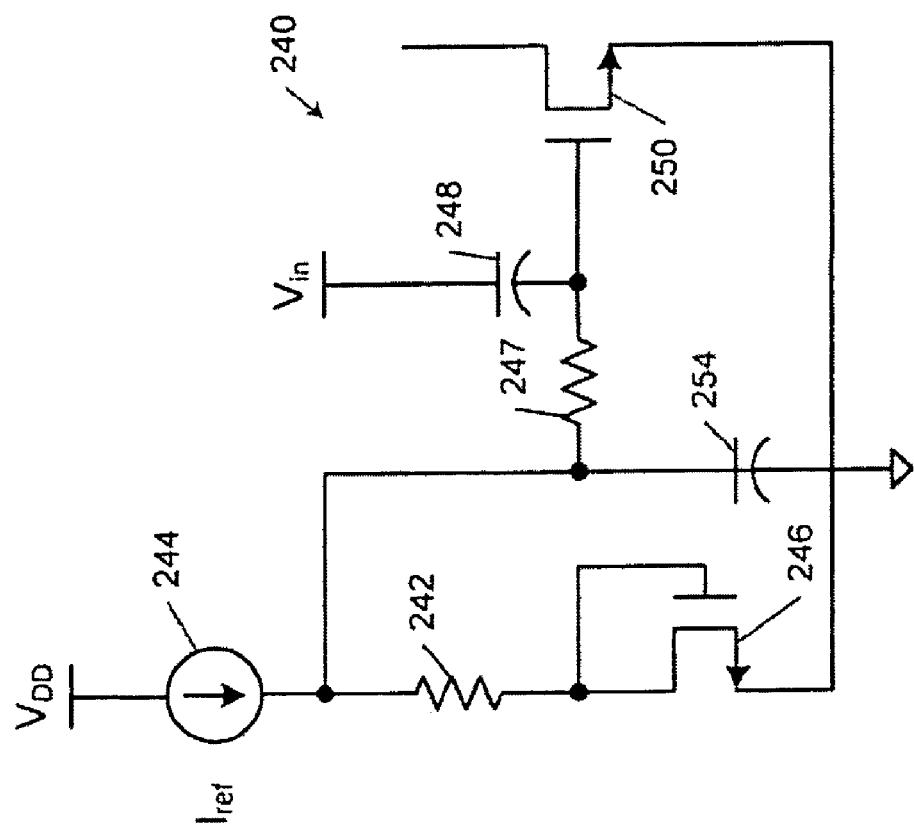
FIG. 8 is an electrical schematic of a constant $V_{Dsat}$ biasing circuit according to the present invention.

Linearity of the mixer 200 is improved by using the compensated input transconductor stage 204. However, the mixer 200 may be implemented using transistor technology with an input linear range that varies with temperature and process variations. Referring now to FIG. 8, a constant $V_{Dsat}$ biasing circuit 240 according to the present invention maintains a substantially constant input linear range over temperature and process corners. The input linear range of the compensated transconductor stage 204 is strongly dependent on the $V_{Dsat}$ of the input devices. Without proper biasing, the input linear range can vary widely over temperature and process corners.

The constant $V_{Dsat}$ biasing circuit 240 includes a resistor 242. The resistor 242 is preferably a poly resistor, although the resistor 242 can be a discrete resistor, an external resistor, or any other resistor. A current source 244 generates a reference current $I_{ref}$. The resistor 242 has one end connected to the current source 244 and an opposite end connected to a drain of a transistor 246.

The current source 244 is generated by a band-gap voltage $V_{BG}$ across the resistor 242. The IR drop across the resistor ($I_{ref}$*R) is substantially constant with respect to temperature and process variation. The constant $V_{Dsat}$ biasing circuit 240 further includes a resistor 247 having one end coupled to a capacitor 248 and a gate of a transistor 250. An opposite end of the resistor 247 is coupled to a capacitor 254 and to the one end of the resistor 242. An opposite end of the capacitor 248 is connected to a voltage input. An opposite end of the capacitor 254 and sources of the transistors 246 and 250 are connected to a reference potential such as ground.

The transistor 246 is biased at an edge of the threshold region. $V_{Gs}$ of the transistor 246 is approximately equal to a threshold voltage ($V_T$) of the transistor 246. The transistor 250 preferably has a size channel length that is approximately the same as the transistor 246. Therefore, the second transistor 250 has approximately the same threshold voltage ($V_T$) as the transistor 246. $V_{Dsat}$ of the transistor 250 is approximately equal to $V_{Gs}$(transistor 250)–$V_T$ [$I_{ref}$*R+$V_{GS}$(transistor 246)–$V_T$]≈$I_{ref}$*R (when $V_{Dsat}$ of transistor 246≈0 is used). As a result, $V_{Dsat}$ of transistor 250≈$I_{ref}$*R is independent of temperature and process variation.

Figure 9:
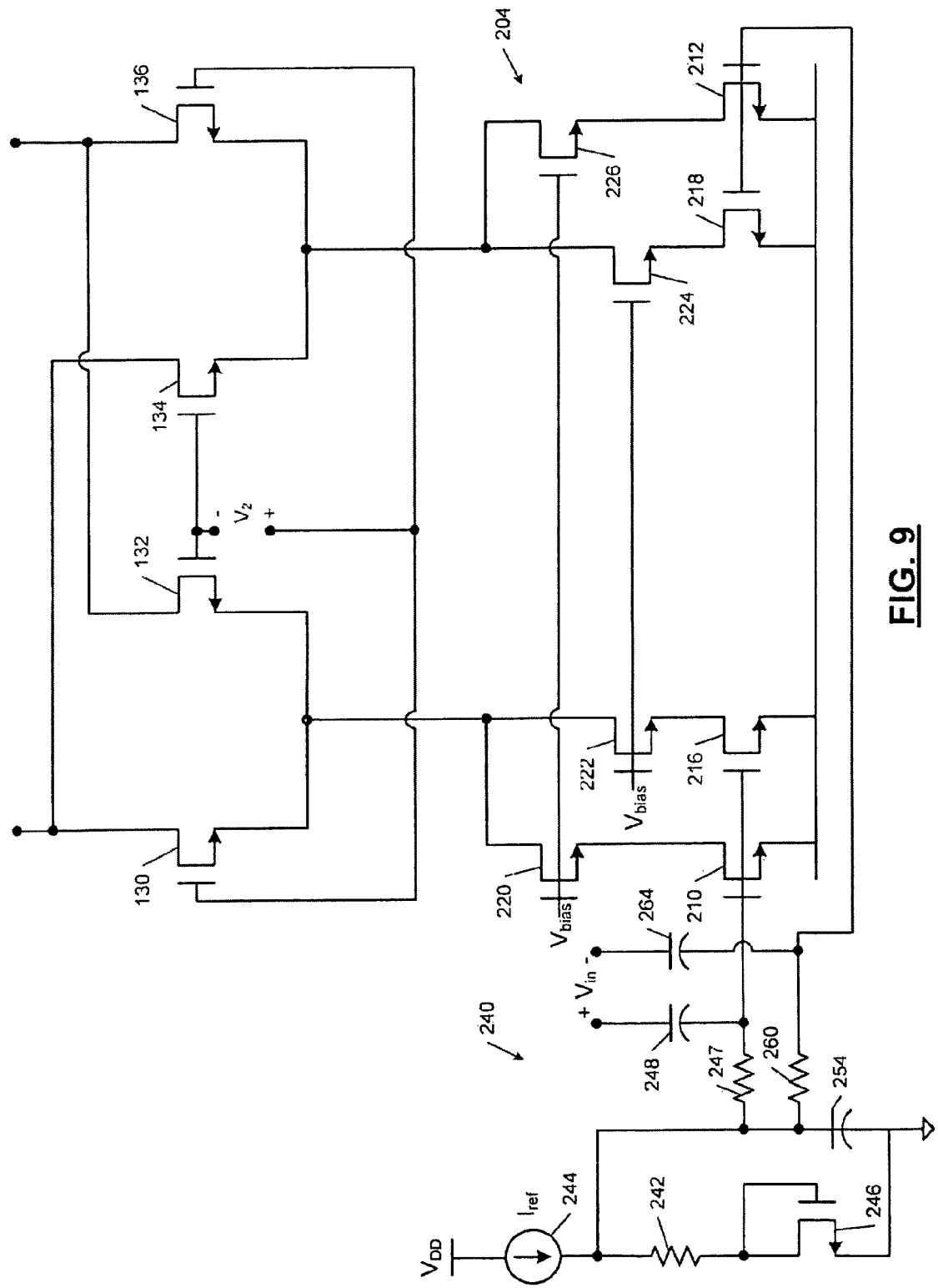
FIG. 9 is an electrical schematic of a Gilbert cell mixer including the compensated input transconductor stage and the constant $V_{Dsat}$ biasing circuit according to the present invention.

Referring now to FIG. 9, the constant $V_{Dsat}$ biasing circuit 240 is connected to the compensated transconductor stage 204 of the Gilbert cell mixer 200. The capacitor 248 and the resistor 247 are connected to the gates of transistors 210 and 216. An additional bias resistor 260 and a capacitor 264 are provided. One end of the resistor 260 is connected to the current source 244, the resistor 242, the capacitor 254 and the resistor 247. An opposite end of the resistor 260 is coupled to one end of the capacitor 264 and to the gates of the transistors 212 and 218. An opposite end of the capacitor 264 is connected to the voltage source.

Figure 10:
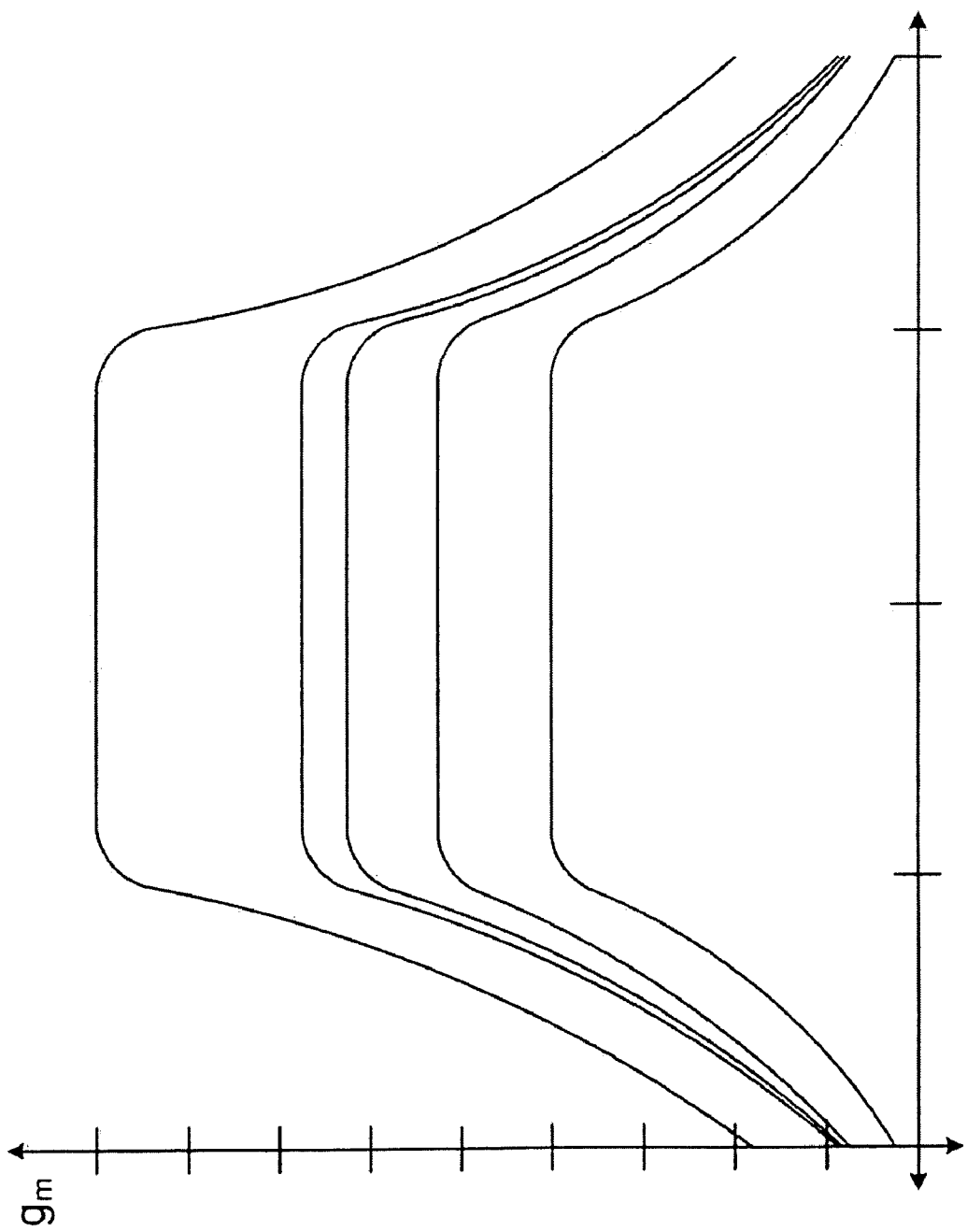
FIG. 10 shows transconductance of compensated input transconductor stages as a function of differential input voltage over five exemplary temperature/process corners.

Referring now to FIG. 10, the transconductance of the compensated input transconductor stage 204 with constant $V_{Dsat}$ bias is shown over five temperature/process corners (typical 50° C., fast 100° C., fast 0° C., slow 100° C., slow 0°

C.). By using the constant $V_{Dsat}$ biasing scheme, the input linear range of the transconductor (and therefore the mixer 200) is approximately constant over temperature and process variations. Even though a substantially constant transconductance range was achieved across process and environmental variations by using the constant overdrive (constant $V_{Dsat}$) biasing scheme, the curves also indicate that the absolute $g_m$ values vary significantly. This, however, can be overcome by employing $g_m$ calibration in conjunction with the constant overdrive bias. As mentioned earlier, $g_m$ is proportional to the drain current $I_D$. Therefore, $g_m$ can be calibrated by simply calibrating the amount of drain current at the input transistors.

Figure 11:
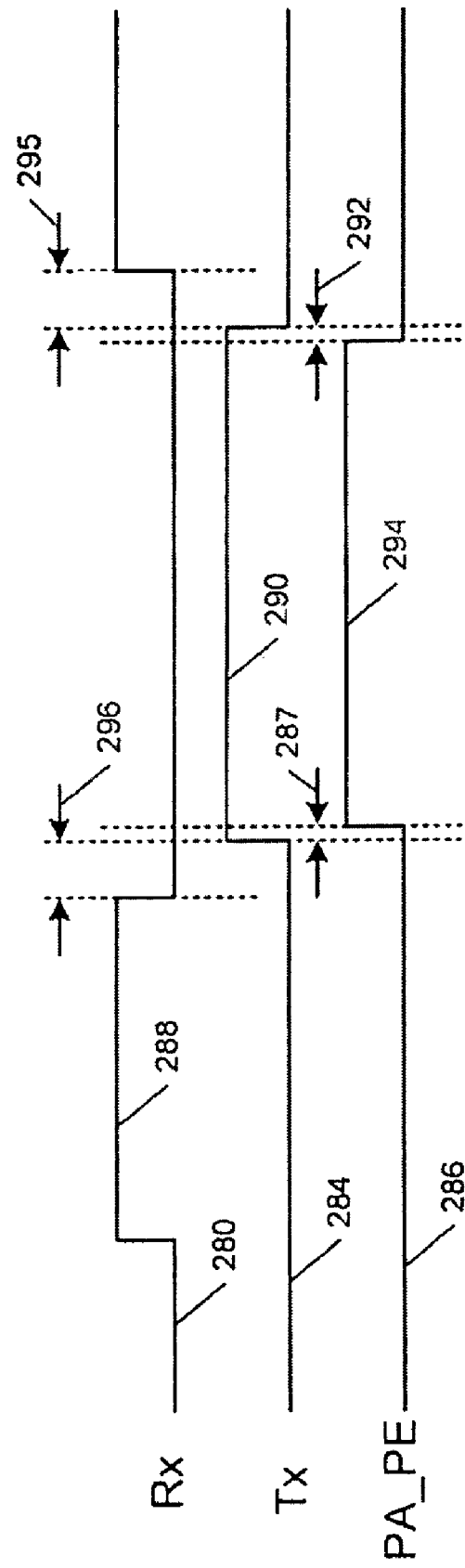
FIG. 11 illustrates the timing of power amplifier, receiver and transmitter enable signals.

Referring now to FIG. 11, receiver, transmitter and power amplifier enable signals 280, 284, and 286, respectively, are shown. Calibration of transmitter and receiver performance parameters can be performed at any time. However, full calibration is preferably performed after power on, software reset and/or hardware reset. Packet-based calibration is preferably performed during idle time between data packets.

For example, packet-based transmitter mixer calibration according to the present invention can be performed during a first idle time period 287 between transmitter enable 290 and power amplifier enable 294. Transmitter calibration can also be performed during a second idle time period 292 between power amplifier enable 294 and a falling edge of transmitter enable 290. Skilled artisans will appreciate that transmitter calibration can be performed during any other idle time between data packets and/or during period 296. The minimum turn-around time from Rx to Tx is 10 μs.

Packet-based receiver mixer calibration can be performed when the end of receiver signal 288 goes low, or when the end of the transmitter signal 290 goes low. The receiver mixer calibration can also be performed during one of the first and second idle time periods 287 and 292. Skilled artisans will appreciate that mixer gain calibration can performed during any other idle time period without departing from the invention.

Figure 12:
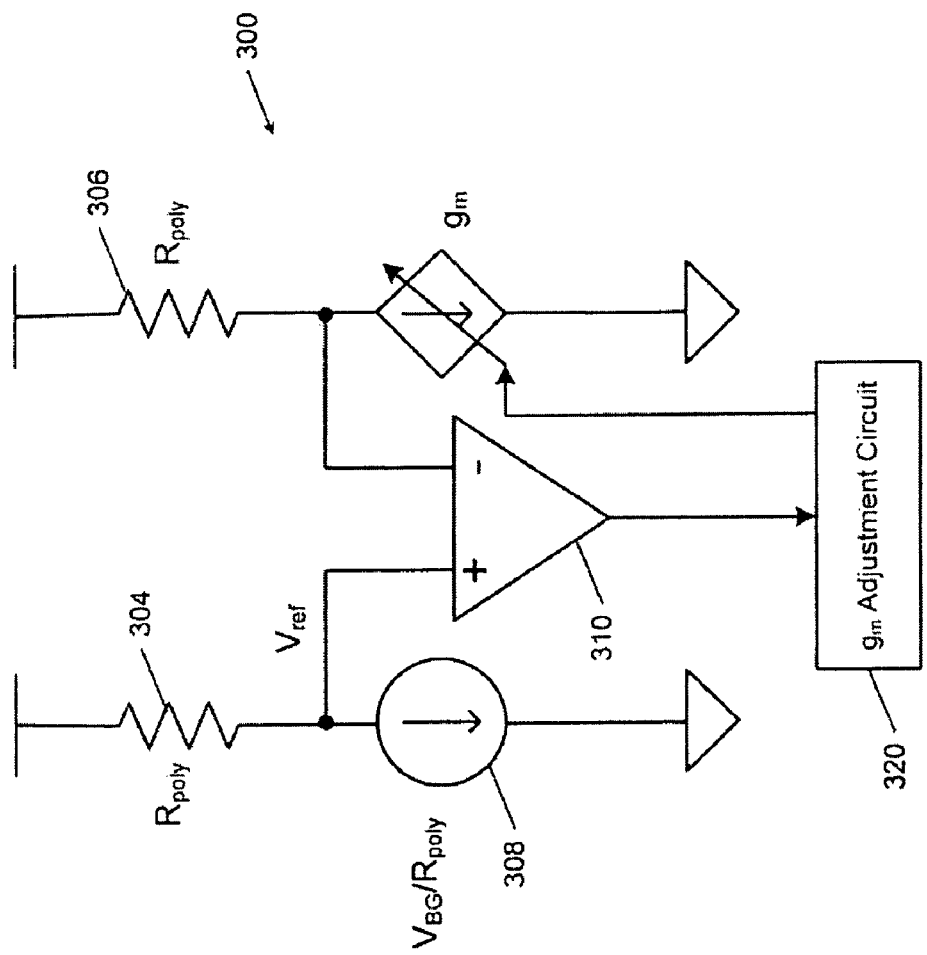
FIG. 12 illustrates a simplified RF mixer gain calibration circuit.

Referring now to FIG. 12, a simplified mixer gain calibration circuit 300 is shown. The reference branch consists of current source 308 and resistor 304. The current through 308 is proportional to $V_{BG}/R_{ext}$, where $R_{ext}$ is typically an off-chip resistor with an accurate resistance value. Therefore, the amount of current flowing through resistor 304 is well defined and substantially constant even across temperature. Resistor 306 is the same resistor type as resistor 304. The resistors 304 and 306 can be poly resistors. The current flowing through resistor 306 is defined by the adjustable $g_m$ stages similar to the linearized input stage as in FIG. 9. Recall that the $g_m$ of the linearized input stage (with constant overdrive) is proportional to current.

Referring to the simplified mixer gain calibration circuit 300 as shown in FIG. 12, the $g_m$ of the linearized input stage can be calibrated to the desired value by adjusting the current flowing through the linearized input stage. The calibration of the $g_m$ stage current can be achieved by sensing and comparing the voltages across resistors 304 and 306. Comparator 310 compares the two voltages. The polarity of the comparator output determines if the amount of current through resistor 306 needs to be increased or decreased by switching parallel linearized input devices in or out. As a result, the calibration process along with the constant overdrive biasing allow the input linear range to be controlled across process and temperature while maintaining effectively constant $g_m$. Since the current $I_D$ is a function of both process corners as well as temperature, calibration is preferably performed frequently, such as for every packet. Alternatively, additional circuits may be used to allow calibration frequency to be programmed.

Figure 13:
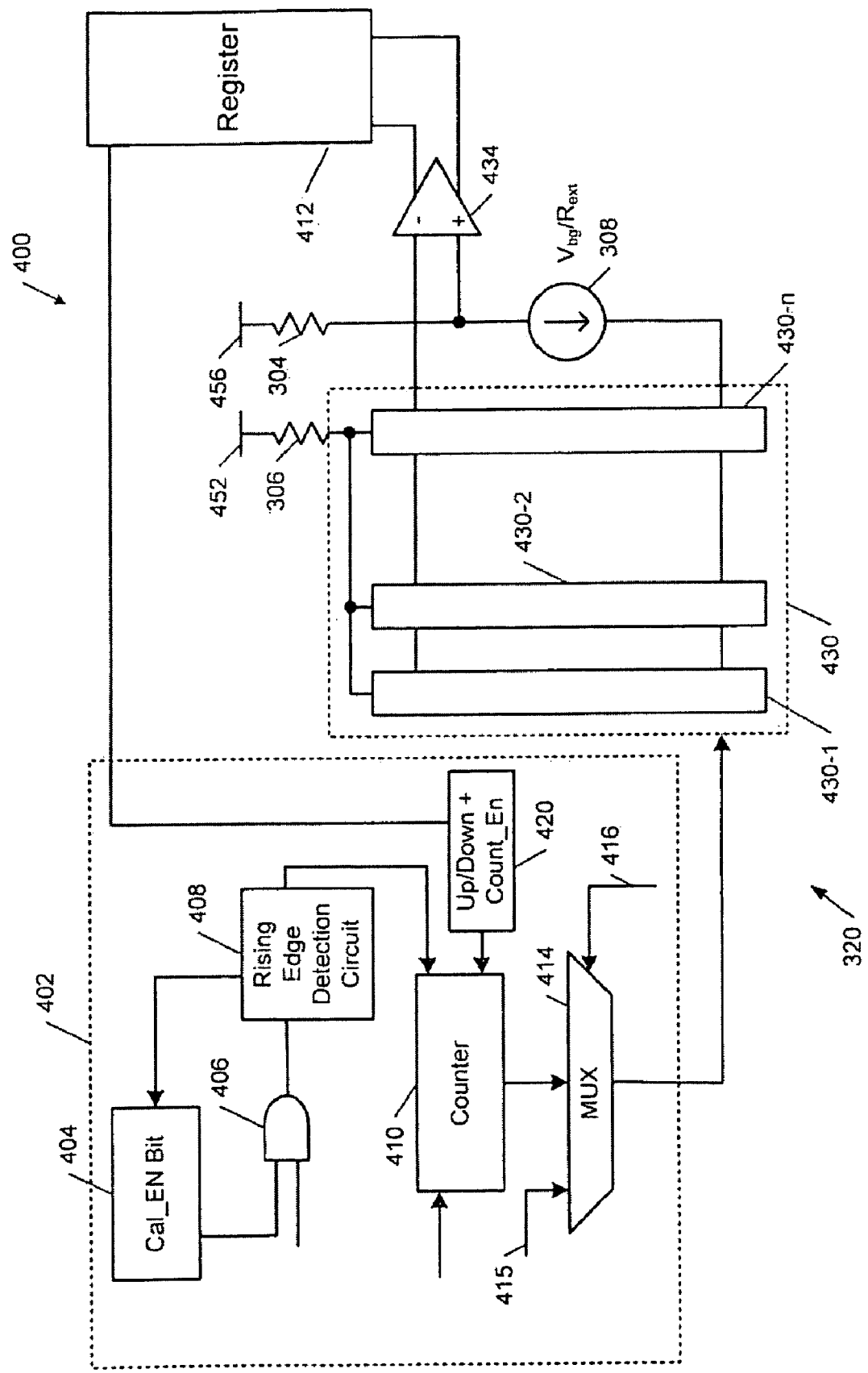
FIG. 13 illustrates a transmitter RF mixer gain calibration circuit including multiple binary weighted $g_m$ stages.
Figure 14:
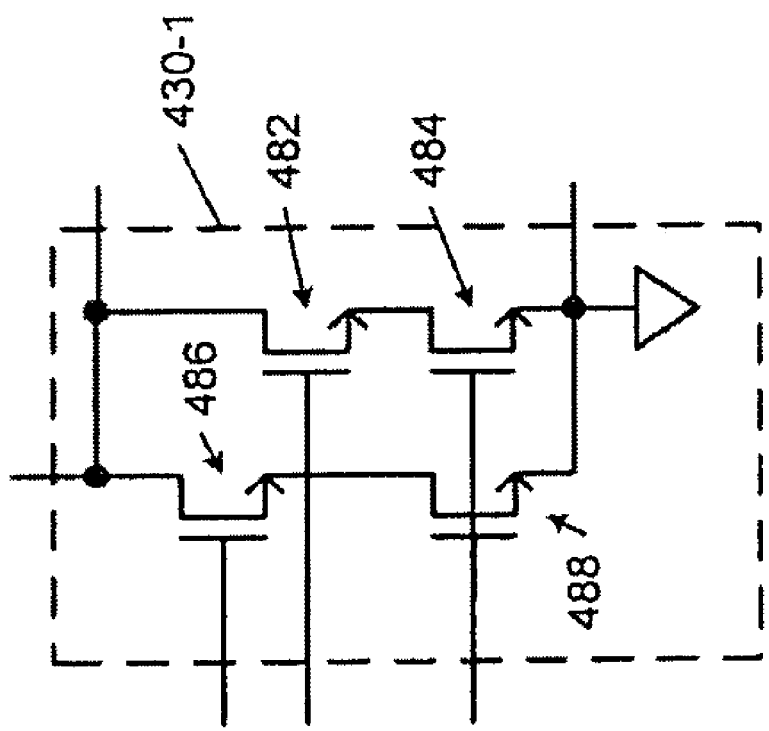
FIG. 14 illustrates an exemplary binary weighted $g_m$ stage.

Referring now to FIGS. 13 and 14, a transmitter and receiver mixer gain calibration circuit 400 is shown and includes a calibration control block 402. The calibration control block 402 includes a calibration enable bit generator 404 that outputs an enable bit to an input of AND gate 406. Another enable signal is also input to the AND gate 406. A rising edge detection circuit 408 receives an output of the AND gate 406 and generates an output signal that is input to the calibration enable bit generator 404 and a counter 410. The counter 410 receives a clock signal. The counter 410 is enabled by a register 412 as will be described further below.

A multiplexer 414 receives an output of the counter 410, inputs directly from a control register at 415 (not shown), and a MUX control signal 416 from the control register. The calibration control block 402 further includes an up/down and counter enable circuit 420, which is coupled to the counter 410.

An output of the multiplexer 414 is input to binary weighted $g_m$ stages 430-1, 430-2 . . . , and 430-$n$ (collectively 430). Outputs of the binary weighted $g_m$ stages 430 are input to a comparator 434 having outputs connected to the register 412. A voltage source 452 and a resistor 304 are connected to a final stage 430-$n$ of the binary weighted $g_m$ stage 430. A voltage source 456 and the resistor 304 are connected to one input of the comparator 434. An output of the register 412 is connected to the up/down and count_enable circuit 420. In FIG. 14, each stage 430-1, 430-2, . . . , and 430-$n$ of the binary weighted $g_m$ stages 430 includes a plurality of switches 482, 484, 486, and 488, that are connected as shown.

In an exemplary embodiment, the transmitter and receiver gain calibration protocol has two phases. Full calibration is performed when the transceiver 10 is powered up, exits from power down, has a hardware and/or software reset, and when the frequency synthesizer changes channels. As can be appreciated, full calibration may be performed in other circumstances as well.

For full calibration, the counter 410 is reset to "0"s and the up/down-count state is also reset to "up" at the beginning of the calibration cycle. When the comparator 434 output is a first state, the counter 410 counts in an "up" direction. The counter 410 continues to count upward until the output of the comparator 434 changes state. When the comparator 434 changes state, the counter 410 starts a downward count. The counter 410 stops counting when the state changes a predetermined number of consecutive times from up to down. For example, up, up, up, up, down, up, down, up. The counter 410 is cleared at the beginning of full calibration.

Incremental or packet-based calibration is performed during idle time as described above in conjunction with FIG. 11. Instead of allowing the mixer to go into sleep mode, the mixer remains active until the incremental calibration is completed. Instead of resetting the up/down counter 410 to all "0"s (as in the full-calibration case), the calibration starts at an existing counter value. The calibration stops when the up/down and count enable circuit 420 transitions or after the predetermined number of clock cycles.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A receiver comprising:
a Gilbert cell mixer comprising an input transconductance stage, the input transconductance stage including:
first and second transistors configured to receive an input signal and provide a first gain characteristic, wherein the first gain characteristic is non-linear over an operating frequency range of the receiver; and
third and fourth transistors configured to receive the input signal and provide a second gain characteristic, wherein the second gain characteristic is non-linear over the operating frequency range of the receiver; and
a gain calibration circuit configured to adjust a transconductance gain of the Gilbert cell mixer based on a reference signal and a mixer bias current,
wherein a combined gain characteristic of the input transconductance stage (i) is based on the first and second gain characteristics and (ii) is linear over the operating frequency range of the receiver.

2. The receiver of claim 1, wherein the gain calibration circuit includes:
a reference signal generator configured to generate the reference signal;
a comparator configured to generate a difference signal corresponding to a difference between the reference signal and a second signal, wherein the second signal is a function of the mixer bias current flowing through the Gilbert cell mixer; and
an adjustment circuit configured to adjust the transconductance gain of the Gilbert cell mixer based on the difference signal.

3. The receiver of claim 2, wherein the transconductance gain of the Gilbert cell mixer is based on a bias current of the Gilbert cell mixer.

4. The receiver of claim 2, wherein the adjustment circuit includes a plurality of binary weighted transconductance cells.

5. The receiver of claim 2, wherein the adjustment circuit includes a plurality of thermometer coded transconductance cells.

6. The receiver of claim 2, wherein the transconductance gain is calibrated during idle time between data packets.

7. The receiver of claim 2, wherein the transconductance gain is calibrated subsequent to at least one of:
a power ON event;
a hardware reset; and
a software reset.

8. The receiver of claim 2, wherein the reference signal generator includes a matched resistor and a current source.

9. The receiver of claim 1, wherein the first and second transistors are operated in a saturation region.

10. The receiver of claim 9, wherein the third and fourth transistors are operated in a triode region.

11. A transmitter comprising:
a Gilbert cell mixer comprising an input transconductance stage, the input transconductance stage including:
first and second transistors configured to (i) receive an input signal and (ii) provide a first gain characteristic, wherein the first gain characteristic is non-linear over an operating frequency range of the transmitter; and
third and fourth transistors configured to (i) receive the input signal and (ii) provide a second gain characteristic, wherein the second gain characteristic is non-linear over the operating frequency range of the transmitter; and a gain calibration circuit configured to adjust a transconductance gain of the Gilbert cell mixer based on a reference signal and a mixer bias current, wherein a combined gain characteristic of the input transconductance stage (i) is based on the first and second gain characteristics and (ii) is linear over the operating frequency range of the transmitter.

12. The transmitter of claim 11, wherein the gain calibration circuit includes:
   a reference signal generator configured to generate the reference signal;
   a comparator configured to generate a difference signal corresponding to a difference between the reference signal and a second signal, wherein the second signal is a function of the mixer bias current flowing through the Gilbert cell mixer; and
   an adjustment circuit configured to adjust a transconductance gain of the Gilbert cell mixer based on the difference signal.

13. The transmitter of claim 12, wherein the transconductance gain of the Gilbert cell mixer is based on a bias current of the Gilbert cell mixer.

14. The transmitter of claim 12, wherein the adjustment circuit includes a plurality of binary weighted transconductance cells.

15. The transmitter of claim 12, wherein the adjustment circuit includes a plurality of thermometer coded transconductance cells.

16. The transmitter of claim 12, wherein the transconductance gain is calibrated during idle time between data packets.

17. The transmitter of claim 12, wherein the transconductance gain is calibrated subsequent to at least one of:
   a power ON event;
   a hardware reset; and
   a software reset.

18. The transmitter of claim 12, wherein the reference signal generator includes a matched resistor and a current source.

19. The receiver of claim 2, wherein:
   control terminals of the first and second transistors and control terminals of the third and fourth transistors receive a bias current from the adjustment circuit, and
   the adjustment circuit adjusts the bias current to adjust the transconductance gain of the Gilbert cell mixer.

20. The transmitter of claim 11, wherein the first and second transistors are operated in a saturation region.

21. The transmitter of claim 20, wherein the third and fourth transistors are operated in a triode region.

22. A receiver comprising:
   a Gilbert cell mixer comprising an input transconductance stage, the input transconductance stage including:
      first and second transistors configured to (i) receive an input signal and (ii) provide a first gain characteristic, wherein the first gain characteristic is non-linear over an operating frequency range of the receiver; and
      third and fourth transistors configured to (i) receive the input signal and (ii) provide a second gain characteristic, wherein the second gain characteristic is non-linear over the operating frequency range of the receiver; and
   a gain calibration circuit that comprises:
      a reference signal generator configured to generate a reference signal;
      a comparator configured to (i) receive the reference signal and a second signal and (ii) generate a difference signal, wherein the second signal is a function of a mixer bias current flowing through the Gilbert cell mixer; and
      an adjustment circuit configured to adjust transconductance gain of the Gilbert cell mixer based on the difference signal,
   wherein a combined gain characteristic of the input transconductance stage is based on the first and second gain characteristics and is linear over the operating frequency range of the receiver.

* * * * *